US012630916B2

(12) United States Patent
Zhong et al.

(10) Patent No.: US 12,630,916 B2
(45) Date of Patent: May 19, 2026

(54) STRESS CONTROL METHOD FOR PHYSICAL VAPOR DEPOSITION OF ALUMINUM

(71) Applicant: Applied Materials, Inc., Santa Clara, CA (US)

(72) Inventors: Yaoying Zhong, Singapore (SG); Haomin Xu, Singapore (SG); Siew Kit Hoi, Singapore (SG); Jay Min Soh, Singapore (SG); Xiao Tan, Singapore (SG); Li Ying Choo, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/523,238

(22) Filed: Nov. 29, 2023

(65) Prior Publication Data

US 2025/0171887 A1     May 29, 2025

(51) Int. Cl.
| | |
|---|---|
| *C23C 14/14* | (2006.01) |
| *C23C 14/02* | (2006.01) |
| *C23C 14/34* | (2006.01) |
| *C23C 14/58* | (2006.01) |

(52) U.S. Cl.
CPC .............. *C23C 14/14* (2013.01); *C23C 14/02* (2013.01); *C23C 14/34* (2013.01); *C23C 14/5806* (2013.01)

(58) Field of Classification Search
CPC ......... C23C 14/14; C23C 14/02; C23C 14/34; C23C 14/5806
See application file for complete search history.

(56) References Cited

U.S. PATENT DOCUMENTS

| | | | |
|---|---|---|---|
| 9,847,221 B1 | 12/2017 | McLaughlin et al. | |
| 10,410,979 B2 | 9/2019 | Hua et al. | |
| 10,622,233 B2 | 4/2020 | Hooge et al. | |
| 2002/0078550 A1* | 6/2002 | Shimazawa ........... | C23C 14/568 29/603.07 |
| 2004/0244684 A1* | 12/2004 | Tsunoda ................ | C23C 14/568 118/712 |
| 2004/0253828 A1* | 12/2004 | Ozawa .............. | H01J 37/32082 257/E21.279 |
| 2007/0045103 A1* | 3/2007 | Lee ........................ | C23C 14/025 204/192.15 |
| 2007/0138001 A1 | 6/2007 | Ko et al. | |
| 2008/0149597 A1* | 6/2008 | Plumhoff .......... | H01J 37/32623 216/67 |

(Continued)

FOREIGN PATENT DOCUMENTS

| WO | 2020038642 A1 | 2/2020 |
|---|---|---|

OTHER PUBLICATIONS

PCT International Search Report and Written Opinion in PCT/US2024/057227 dated Mar. 11, 2025, 10 pages.

*Primary Examiner* — Patrick S Ott

(74) *Attorney, Agent, or Firm* — SERVILLA WHITNEY LLC

(57) ABSTRACT

Provided are methods of reducing the stress of a semiconductor wafer. The method includes exposing depositing an aluminum layer on a top surface of a substrate; and cooling the substrate to a temperature of less than or equal to 20° C., or less than or equal to 10° C., or less than or equal to 0° C., or less than or equal to −20° C. In some embodiments, the method is conducted within a processing tool, e.g., a cluster tool.

13 Claims, 4 Drawing Sheets

10

EXPOSE SUBSTRATE TO VACUUM — 12

COOL SUBSTRATE — 14

DEPOSIT AN ALUMINUM LAYER ON THE SUBSTRATE — 16

COOL SUBSTRATE TO A TEMPERATURE LESS THAN OR EQUAL TO -20 °C — 18

WARM SUBSTRATE TO ROOM TEMPERATURE — 20

(56)    References Cited

U.S. PATENT DOCUMENTS

| | | | |
|---|---|---|---|
| 2009/0050468 A1* | 2/2009 | Allen | H01L 21/2855 |
| | | | 204/192.1 |
| 2011/0024047 A1* | 2/2011 | Nguyen | C23C 14/564 |
| | | | 118/723 R |
| 2013/0087447 A1* | 4/2013 | Bodke | C23C 14/046 |
| | | | 204/192.15 |
| 2014/0273421 A1* | 9/2014 | Chan | H01L 21/265 |
| | | | 118/695 |
| 2016/0189975 A1* | 6/2016 | Takeda | H01J 37/32091 |
| | | | 438/712 |
| 2016/0371423 A1 | 12/2016 | Vukkadala et al. | |
| 2017/0117119 A1* | 4/2017 | DeVito | C23C 14/12 |
| 2018/0076385 A1 | 3/2018 | Fuji et al. | |
| 2018/0090307 A1 | 3/2018 | Brunner et al. | |
| 2018/0364579 A1 | 12/2018 | Tsai et al. | |
| 2019/0304784 A1 | 10/2019 | Pawashe et al. | |
| 2020/0098702 A1 | 3/2020 | Sheng et al. | |
| 2021/0189545 A1* | 6/2021 | Hoi | C23C 14/3435 |
| 2021/0262082 A1 | 8/2021 | Lin et al. | |
| 2022/0285212 A1* | 9/2022 | Ren | H01L 21/76843 |
| 2022/0344282 A1 | 10/2022 | Subrahmanyan et al. | |

* cited by examiner

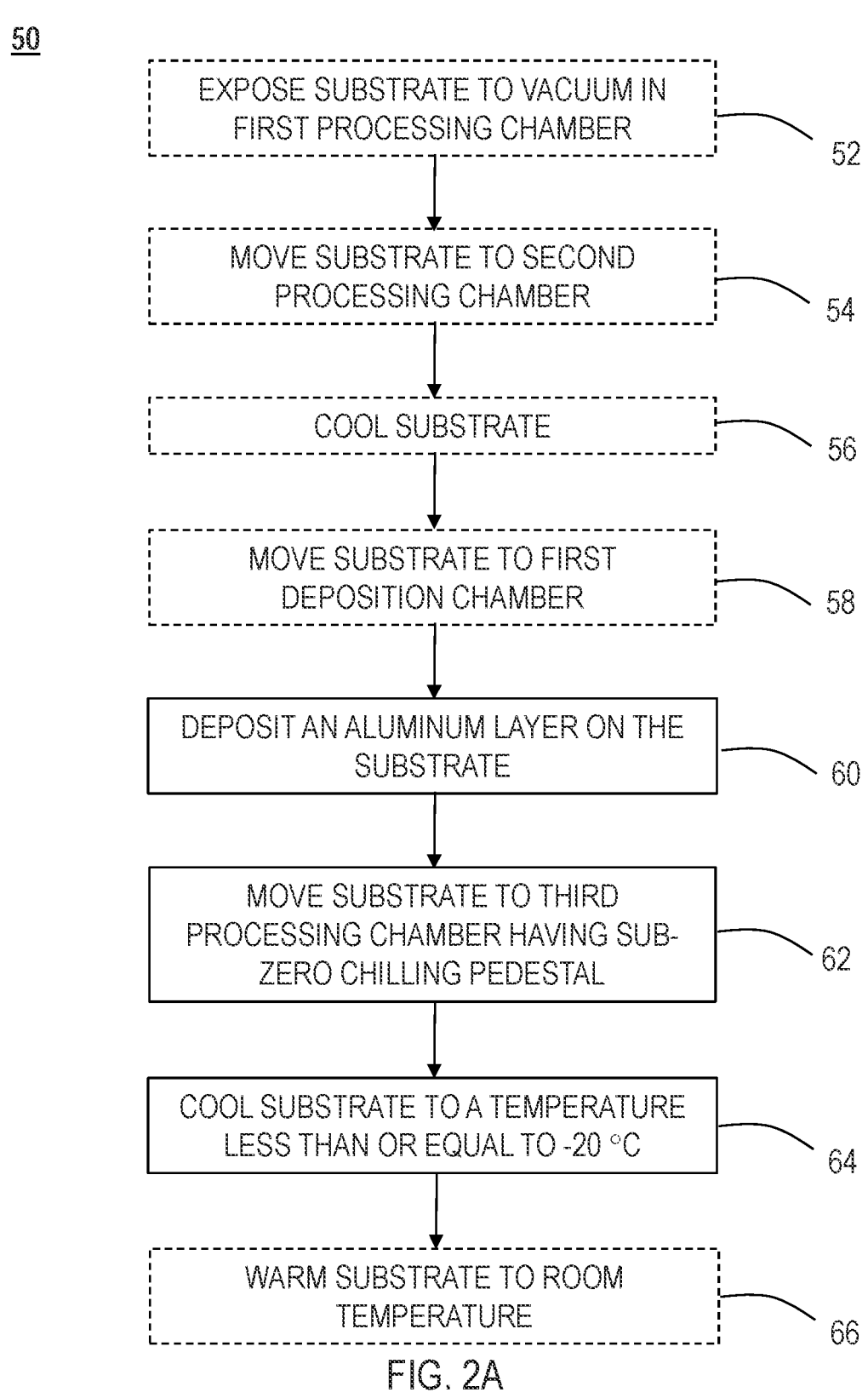

50

EXPOSE SUBSTRATE TO VACUUM IN FIRST PROCESSING CHAMBER — 52

MOVE SUBSTRATE TO SECOND PROCESSING CHAMBER — 54

COOL SUBSTRATE — 56

MOVE SUBSTRATE TO FIRST DEPOSITION CHAMBER — 58

DEPOSIT AN ALUMINUM LAYER ON THE SUBSTRATE — 60

MOVE SUBSTRATE TO THIRD PROCESSING CHAMBER HAVING SUB-ZERO CHILLING PEDESTAL — 62

COOL SUBSTRATE TO A TEMPERATURE LESS THAN OR EQUAL TO -20 °C — 64

WARM SUBSTRATE TO ROOM TEMPERATURE — 66

FIG. 2A

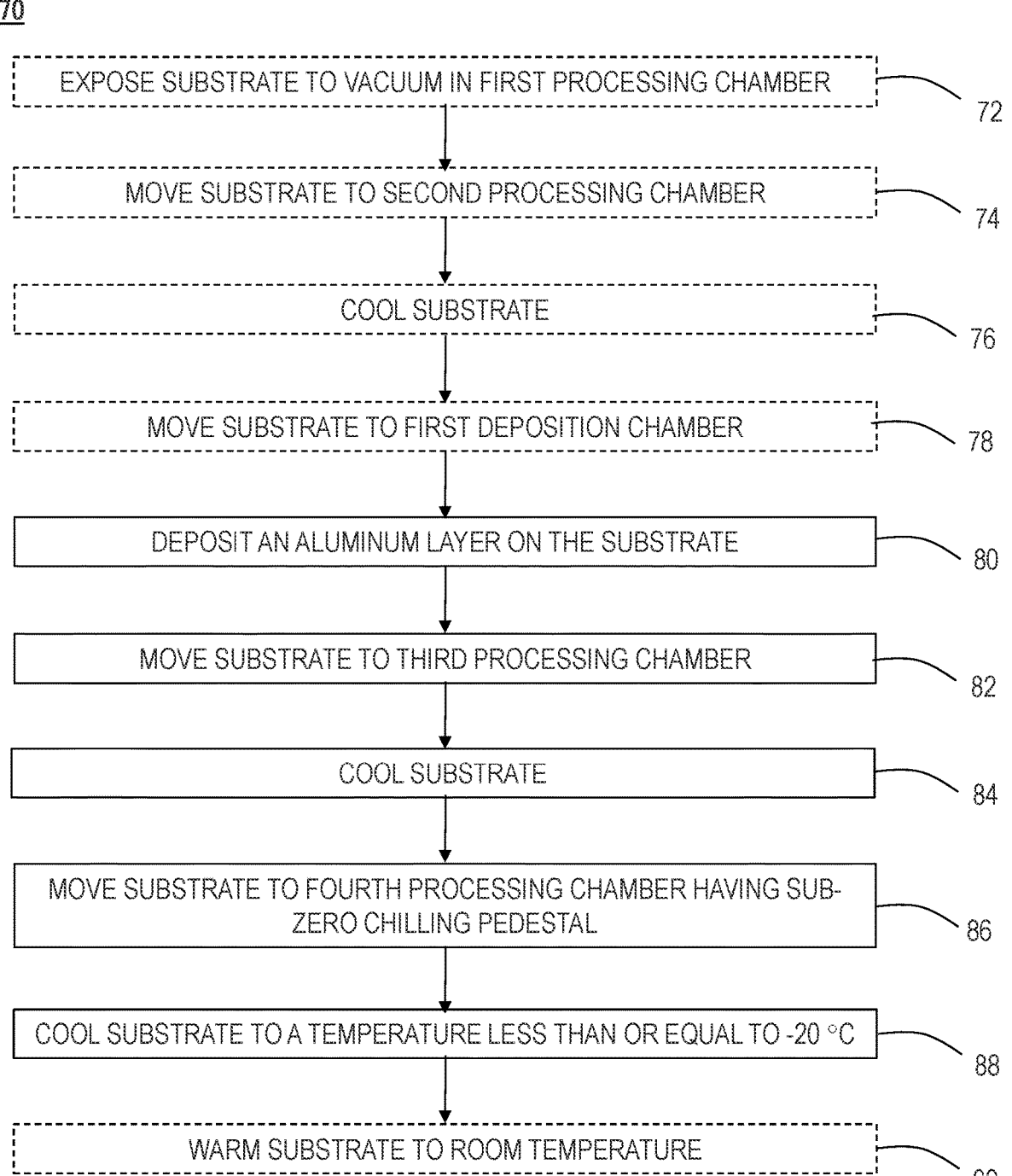

70

EXPOSE SUBSTRATE TO VACUUM IN FIRST PROCESSING CHAMBER — 72

MOVE SUBSTRATE TO SECOND PROCESSING CHAMBER — 74

COOL SUBSTRATE — 76

MOVE SUBSTRATE TO FIRST DEPOSITION CHAMBER — 78

DEPOSIT AN ALUMINUM LAYER ON THE SUBSTRATE — 80

MOVE SUBSTRATE TO THIRD PROCESSING CHAMBER — 82

COOL SUBSTRATE — 84

MOVE SUBSTRATE TO FOURTH PROCESSING CHAMBER HAVING SUB-ZERO CHILLING PEDESTAL — 86

COOL SUBSTRATE TO A TEMPERATURE LESS THAN OR EQUAL TO -20 °C — 88

WARM SUBSTRATE TO ROOM TEMPERATURE — 90

FIG. 2B

STRESS CONTROL METHOD FOR PHYSICAL VAPOR DEPOSITION OF ALUMINUM

TECHNICAL FIELD

Embodiments of the present disclosure pertain to the field of semiconductor devices and semiconductor device manufacturing. More particularly, embodiments of the disclosure relate to methods for reducing distortion and stress of a semiconductor wafer.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

As semiconductor nodes advance, and integration process flows become more complicated, stress accumulates on semiconductor wafers, leading to wafer bow that cannot be easily addressed. The inability of being able to address wafer bow limits the adoption of certain higher-stress films that may possess other beneficial properties, such as better etch selectivity and the like.

As the coverage requirement on aluminum (Al) processes increases, AC bias is implemented to further improve aluminum coverage. The introduction of AC power during the process, however, deteriorates film stress. In many cases, film stress limits the amount of AC power usage, and hence limits the coverage performance.

Accordingly, there is a need for methods of reducing the distortions of semiconductor wafers to permit scaling required for advanced node devices.

SUMMARY

One or more embodiments of the disclosure are directed to a method of manufacturing a semiconductor device, the method comprising: depositing an aluminum layer on a top surface of the substrate; and cooling the substrate to a temperature less than or equal to 20° C.

Further embodiments provide a method of reducing stress on a semiconductor substrate. In one or more embodiments, a method of reducing stress on a semiconductor substrate, the method comprising: depositing an aluminum layer on a top surface of the substrate, the substrate in a first deposition chamber; moving the substrate having the aluminum layer thereon to a third processing; and cooling the substrate to a temperature less than or equal to 20° C.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

FIG. 2A illustrates a process flow diagram of a method in accordance with one or more embodiments of the disclosure;

FIG. 2B illustrates a process flow diagram of a method in accordance with one or more embodiments of the disclosure.

Figures 1A, 1B:
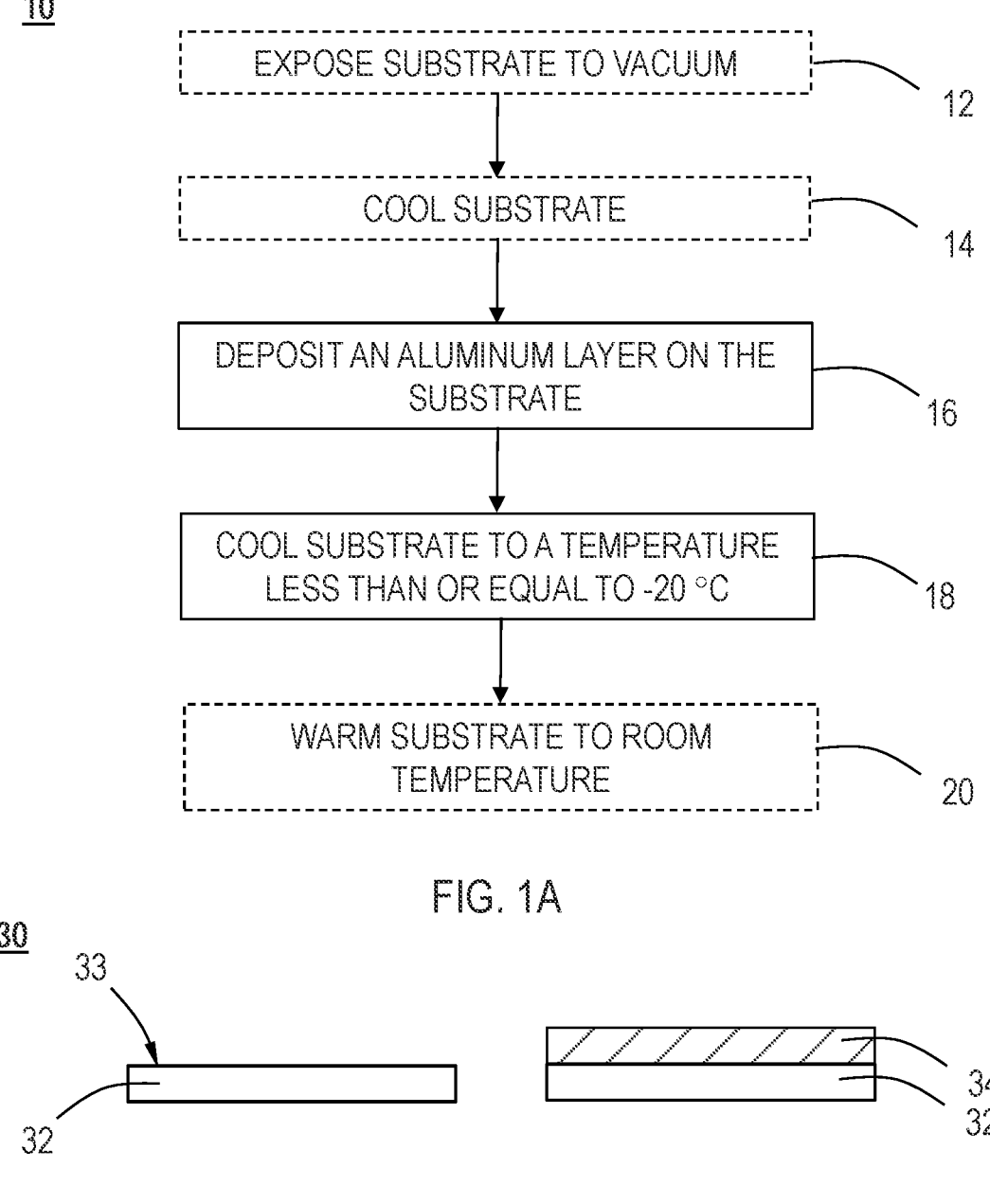
FIG. 1A illustrates a process flow diagram of a method in accordance with one or more embodiments of the disclosure.
FIG. 1B illustrates a cross-section view of a semiconductor device being processed according to the method of one or more embodiments of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of "about."

Spatially relative terms, such as "beneath," "below," "lower," "above," "upper" and the like, may be used herein for ease of description to describe one element or feature's relationship to another element(s) or feature(s) as illustrated in the Figures. It will be understood that the spatially relative terms are intended to encompass different orientations of a device in use or operation in addition to the orientation depicted in the figures. For example, if the device in the Figures is turned over, elements described as "below," or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

As used in this specification and the appended claims, the term "substrate" or "wafer" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The substrate surface may have one or more features formed therein, one or more layers formed thereon, and combinations thereof. The shape of the feature can be any suitable shape including, but not limited to, trenches, holes and vias (circular or polygonal). As used in this regard, the term "feature" refers to any intentional surface irregularity. Suitable examples of features include but are not limited to trenches, which have a top, two sidewalls and a bottom extending into the substrate, vias which have one or more sidewall extending into the substrate to a bottom, and slot vias. The features described herein can have any suitable aspect ratio (ratio of the depth of the feature to the width of the feature). In one or more embodiments, the aspect ratio of the features described herein is greater than or equal to about 1:4, 1:3, 1:2, 1:1, 2:1, 5:1, 10:1, 15:1, 20:1, 25:1, 30:1, 35:1, or 40:1.

The term "on" indicates that there is direct contact between elements. The term "directly on" indicates that there is direct contact between elements with no intervening elements.

As used in this specification and the appended claims, the terms "precursor," "reactant," "reactive gas" and the like are used interchangeably to refer to any gaseous species that can react with the substrate surface.

Sputtering is a physical vapor deposition (PVD) process in which high-energy ions impact and erode a solid target and deposit the target material on the surface of a substrate, such as a semiconductor substrate. In semiconductor fabrication, the sputtering process is usually accomplished within a semiconductor fabrication chamber also known as a PVD processing chamber or a sputtering chamber. Sputtering has long been used for the deposition of metals and related materials in the fabrication of semiconductor integrated circuits.

Typically, the sputtering chamber comprises an enclosure wall that encloses a process zone into which a process gas is introduced, a gas energizer to energize the process gas, and an exhaust port to exhaust and control the pressure of the process gas in the chamber. The chamber is used to sputter deposit a material from a sputtering target onto the semiconductor substrate. In the sputtering processes, the sputtering target is bombarded by energetic ions, such as a plasma, causing material to be knocked off the target and deposited as a film on the semiconductor substrate.

A typical semiconductor fabrication chamber has a target assembly including disc-shaped target of solid metal or other material supported by a backing plate that holds the target. To promote uniform deposition, the PVD chamber may have an annular concentric metallic ring, which is often called a shield, circumferentially surrounding the disc-shaped target.

Plasma sputtering may be accomplished using either DC sputtering or RF sputtering. Plasma sputtering typically includes a magnetron positioned at the back of a sputtering target including two magnets of opposing poles magnetically coupled at their back through a magnetic yoke to project a magnetic field into the processing space to increase the density of the plasma and enhance the sputtering rate from a front face of the target. Magnets used in the magnetron are typically closed loop for DC sputtering and open loop for RF sputtering.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., hydrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

One or more of the layers deposited on the substrate or substrate surface are continuous. As used herein, the term "continuous" refers to a layer that covers an entire exposed surface without gaps or bare spots that reveal material underlying the deposited layer. A continuous layer may have gaps or bare spots with a surface area less than about 15% or less than about 10% of the total surface area of the layer.

As used herein, the term "in situ" refers to processes that are all performed in the same processing chamber or within different processing chambers that are connected as part of an integrated processing system, such that each of the processes are performed without an intervening vacuum break. As used herein, the term "ex situ" refers to processes that are performed in at least two different processing chambers such that one or more of the processes are performed with an intervening vacuum break. In some embodiments, processes are performed without breaking vacuum or without exposure to ambient air. The method of one or more embodiments may be performed in situ in an integrated processing tool, e.g., a cluster tool. In other embodiments, the method is performed without breaking vacuum or without exposure to ambient air.

Semiconductor devices utilize layers of metals and other materials to form multi-layer stacks and films on a wafer. The multi-layer stacks and films have varying levels of stress, which lead to considerable strain/bow on the wafer. For example, such strain/bow on the wafer can create problems both in chucking of the wafer as well as overlay issues between patterning steps and reducing device yield. One or more embodiments advantageously provide solutions to reduce the stress and distortions caused by deposition of films, aluminum films in particular.

The embodiments of the disclosure are described by way of the Figures, which illustrate processes for forming semiconductor devices and processing tools for executing the processes in accordance with one or more embodiments of the disclosure. The processes shown are merely illustrative possible uses for the disclosed processes, and the skilled artisan will recognize that the disclosed processes are not limited to the illustrated applications.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been described in great detail to avoid unnecessarily obscuring this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Figure 3:
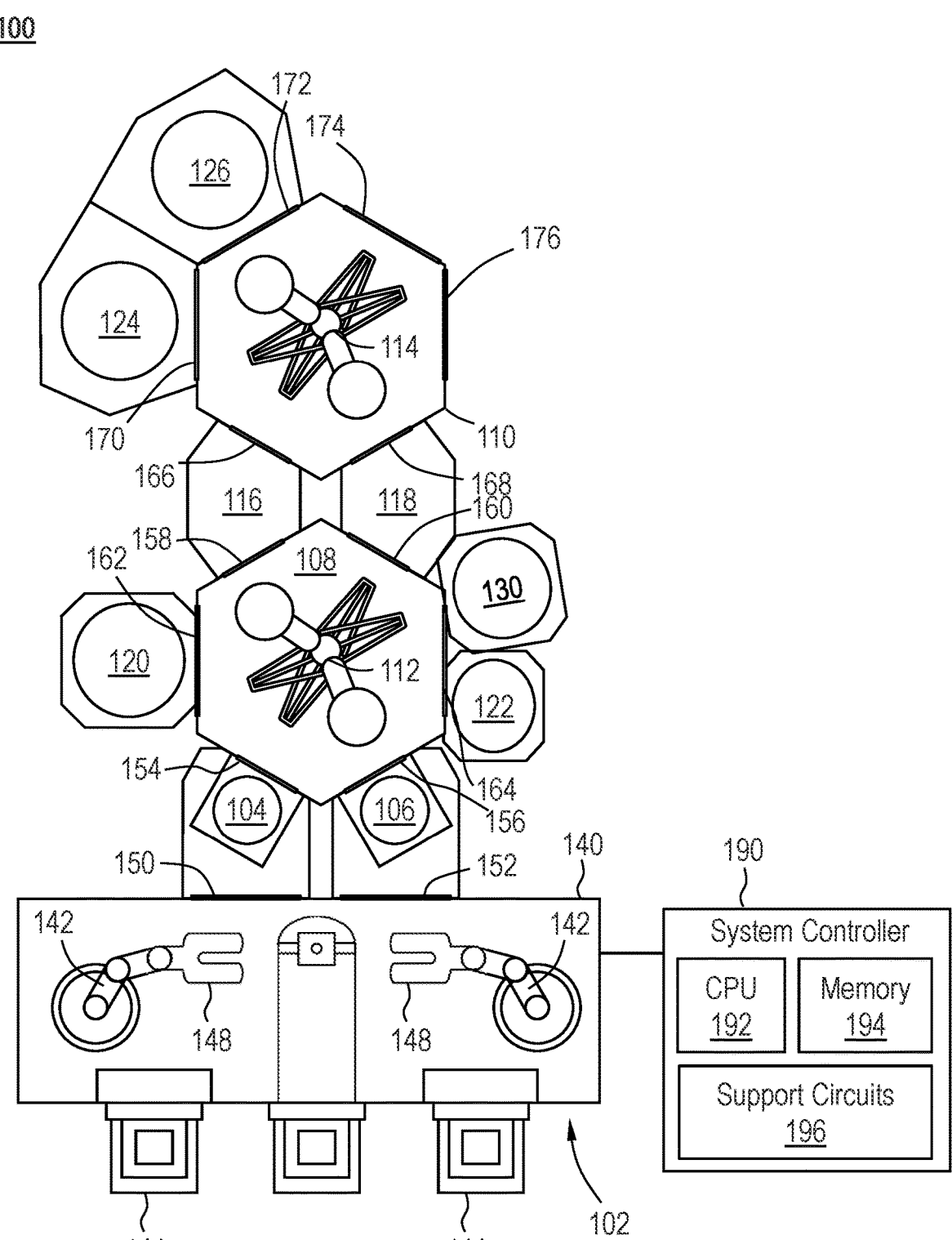
FIG. 3 illustrates a schematic view of a cluster tool in accordance with one or more embodiments of the disclosure.

FIG. 1A illustrates a process flow diagram for a method 10 for forming a semiconductor device in accordance with some embodiments of the present disclosure. FIG. 1B illustrates a cross-section view of a semiconductor device 30 being processed according to the method of one or more embodiments of the disclosure. FIG. 2A illustrates a process flow diagram for a method 50 for forming a semiconductor device in accordance with some embodiments of the present disclosure. FIG. 2B illustrates a process flow diagram for a method 70 for forming a semiconductor device in accordance with some embodiments of the present disclosure. FIG. 3 illustrates a processing tool 100 that may be suitable for carrying out the methods 10, 50, and 70 of one or more embodiments.

In one or more embodiments, the methods 10, 50, and 70 may be performed in any suitable process chamber coupled to a processing tool, e.g., a cluster tool like that illustrated in FIG. 3. The cluster tool 100 may include process chambers for fabricating a semiconductor device, such as chambers configured for cooling, deposition, physical vapor deposition (PVD), chemical vapor deposition (CVD), oxidation, or any other suitable chamber used for the fabrication of a semiconductor device.

Referring to FIG. 1A, at operation 12 of method 10, a substrate is provided and exposed to a vacuum. As used in this specification and the appended claims, the term "provided" means that the substrate is made available for processing (e.g., positioned in a processing chamber). At operation 14, the substrate is, optionally, cooled. At operation 16, an aluminum layer is deposited on the substrate. At operation 18, the substrate is cooled to a temperature of less than or equal to 20° C., or less than or equal to 10° C., or less than or equal to 0° C., or less than or equal to −20° C. At optional operation 20, the substrate may be warmed to room temperature.

With reference to FIG. 1A and FIG. 1B, in one or more embodiments, the substrate or wafer 32 may comprise any suitable substrate known to the skilled artisan. In some embodiments, the substrate or wafer 32 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 32 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate comprises one or more of silicon (Si), germanium (Ge), gallium (Ga), arsenic (As), phosphorus (P), silicon carbide (SiC), silicon oxide (SiOx), gallium arsenide (GaAs), and the like. Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

With reference to FIG. 1A and FIG. 1B, at operation 12, the substrate 32 is exposed to a vacuum. As used herein, the phrase "exposed to a vacuum" means that a purge gas is flowed over the substrate 32 to purge the reaction zone or otherwise remove any residual reactive compounds or reaction-by-products from the surface of the substrate 32 and from the reaction zone. The purge gas may comprise any inert gas known to the skilled artisan. In one or more embodiments, the purge gas is selected from one or more of nitrogen ($N_2$), helium (He), and argon (Ar). In one or more embodiments, the substrate 32 is purged at operation 12 at a temperature in a range of from 150° C. to 400° C.

At operation 14, the substrate 32 is cooled to a temperature in a range or from 50° C. to 150° C., including a temperature of about 50° C., about 60° C., about 70° C., about 80° C., about 90° C., about 100° C., about 110° C., about 120° C., about 130° C., about 140° C., and about 150° C. In some embodiments, the substrate 32 is cooled while also being kept under vacuum.

With reference to FIG. 1A and FIG. 1B, at operation 16, an aluminum layer 34 is deposited on a top surface 33 of the substrate 32. In one or more embodiments, an aluminum (Al) layer 34 is deposited by sputtering or a physical vapor deposition (PVD) process. In one or more embodiments, an aluminum layer 34 is deposited using a direct current (DC) PVD process by sputtering a metal target and supplying a radiofrequency (RF) to the pedestal. Accordingly, an aluminum target is sputtered onto the semiconductor substrate 32 to form the aluminum (A) layer 34.

In one or more embodiments, the PVD process comprises RF sputtering and DC sputtering. In one or more embodiments, the DC is supplied to the metal target (not shown) and the RF is supplied to the pedestal (not shown). In one or more embodiments, the DC component has a power in a range of from 0 kilowatt (KW) to 100 kW, 10 kW to 80 kW, 20 kW to 60 kW, 30 kW to 50 kW, or 40 kW to 50 kW. In one or more embodiments, RF component has a power in range of from 0 kW to 10 kW, 1 kW to 10 kW, 3 kW to 10 kW, 5 kW to 10 kW, 7 kW to 10 kW, 1 kW to 7 kW, 3 kW to 7 kW, 5 kW to 7 kW, 1 kW to 5 kW, 3 kW to 5 kW, or 1 kW to 3 kW.

In one or more embodiments, the PVD process occurs at a temperature in a range of from 200° C. to 450° C., 250° C. to 450° C., 300° C. to 450° C., 350° C. to 450° C., 400° C. to 450° C., 200° C. to 400° C., 250° C. to 400° C., 300° C. to 400° C., 350° C. to 400° C., 200° C. to 350° C., 250° C. to 350° C., 300° C. to 350° C., 200° C. to 300° C., 250° C. to 300° C., or 200° C. to 250° C.

In one or more embodiments, the PVD process occurs at a pressure in a range of from 0.5 mTorr to 500 mTorr, 10 mTorr to 500 mTorr, 25 mTorr to 250 mTorr, or 50 mTorr to 150 mTorr.

In one or more embodiments, the aluminum (Al) layer 34 has a thickness in a range of from 1 μm to 6 μm, or in a range of from 2 μm to 5 μm. In one or more embodiments, the aluminum (Al) layer 34 is a continuous layer. As used herein, the term "continuous" refers to a layer that covers an entire exposed surface without gaps or bare spots that reveal material underlying the deposited layer. A continuous layer may have gaps or bare spots with a surface area less than about 15% or less than about 10% of the total surface area of the layer. Once the predetermined thickness of the aluminum (Al) layer 34 has been deposited at operation 16, the method 10 moves to operation 18.

At operation 18, the substrate is cooled to a temperature that is less than or equal to –20° C. At operation 20, the substrate 32 may be allowed to warm to room temperature, or in a range of from 20° C. to 25° C.

Without intending to be bound by theory, it is thought that cooling a substrate 32 with an aluminum layer 34 after deposition induces tensile stress in the aluminum layer 32, leading to bowing of the substrate 32. Additionally, heating the aluminum layer 34 after deposition can also induce tensile stress to the aluminum and lead to bowing of the substrate 32. Accordingly, in one or more embodiments, cooling the substrate 32 having the aluminum layer 34 thereon to a temperature that is less than or equal to –20° C. followed by heating the substrate 32 with the aluminum layer 34 thereon counteracts the tensile stress causes by the cooling and reduces the overall film stress and bowing caused.

Referring to FIG. 2A, the method 50 may be performed in a processing tool. At operation 52 of method 50, a substrate is provided and exposed to a vacuum in the first processing chamber. At operation 54, the substrate is moved to a second processing chamber. At operation 56, the substrate is, optionally, cooled. At operation 58, the substrate is moved to the first deposition chamber. At operation 60, an aluminum layer is deposited on the substrate. At operation 62, the substrate is moved to a third processing chamber, the third processing chamber having a sub-zero chilling pedestal, or a sub-zero cooling pedestal, in it. At operation 64, the substrate is cooled to a temperature of less than or equal to 20° C., or less than or equal to 10° C., or less than or equal to 0° C., or less than or equal to –20° C. At optional operation 66, the substrate may be warmed to room temperature.

With reference to FIG. 2A and FIG. 1B, in one or more embodiments, the substrate or wafer 32 may comprise any suitable substrate known to the skilled artisan, as discussed above. At operation 52, the substrate 32 is exposed to a vacuum in a first processing chamber as a purge gas is flowed over the substrate 32 to purge the reaction zone or otherwise remove any residual reactive compounds or reaction-by-products from the surface of the substrate 32 and from the reaction zone. The purge gas may comprise any inert gas known to the skilled artisan. In one or more embodiments, the purge gas is selected from one or more of nitrogen (N$_2$), helium (He), and argon (Ar). In one or more embodiments, the substrate 32 is purged at operation 52 at a temperature in a range of from 150° C. to 400° C.

At operation 54, the substrate 32 is moved to a second processing chamber, where, at operation 56 the substrate 32 is cooled to a temperature in a range or from 50° C. to 150° C., including a temperature of about 50° C., about 60° C., about 70° C., about 80° C., about 90° C., about 100° C., about 110° C., about 120° C., about 130° C., about 140° C., and about 150° C. In some embodiments, the substrate 32 is cooled while also being kept under vacuum.

With reference to FIG. 2A and FIG. 1B, at operation 58, the substrate 32 is moved to a first deposition chamber, where, at operation 60, an aluminum layer 34 is deposited on a top surface 33 of the substrate 32. In one or more embodiments, the aluminum (Al) layer 34 is deposited by sputtering or physical vapor deposition (PVD). In one or more embodiments, an aluminum layer 34 is deposited using a direct current (DC) PVD process or a radiofrequency (RF) PVD process. Accordingly, an aluminum target is sputtered onto the semiconductor substrate 32 to form the aluminum (Al) layer 34.

In one or more embodiments, the PVD process comprises RF sputtering and DC sputtering. In one or more embodiments, the DC is supplied to the semiconductor substrate 32 or metal target and the RF is supplied to the pedestal (not shown). In one or more embodiments, the DC component has a power in a range of from 0 kilowatt (KW) to 100 kW, 10 kW to 80 kW, 20 kW to 60 kW, 30 kW to 50 kW, or 40 kW to 50 kW. In one or more embodiments, RF component has a power in range of from 0 kW to 10 kW, 1 kW to 10 kW, 3 kW to 10 kW, 5 kW to 10 kW, 7 kW to 10 kW, 1 kW to 7 kW, 3 kW to 7 kW, 5 kW to 7 kW, 1 kW to 5 kW, 3 kW to 5 kW, or 1 kW to 3 kW.

In one or more embodiments, the PVD process occurs at a temperature in a range of from 200° C. to 450° C., 250° C. to 450° C., 300° C. to 450° C., 350° C. to 450° C., 400° C. to 450° C., 200° C. to 400° C., 250° C. to 400° C., 300° C. to 400° C., 350° C. to 400° C., 200° C. to 350° C., 250° C. to 350° C., 300° C. to 350° C., 200° C. to 300° C., 250° C. to 300° C., or 200° C. to 250° C.

In one or more embodiments, the PVD process occurs at a pressure in a range of from 0.5 mTorr to 500 mTorr, 10 mTorr to 500 mTorr, 25 mTorr to 250 mTorr, or 50 mTorr to 150 mTorr.

In one or more embodiments, the aluminum (Al) layer 34 has a thickness in a range of from 1 μm to 6 μm, or in a range of from 2 μm to 5 μm. In one or more embodiments, the aluminum (Al) layer 34 is a continuous layer. As used herein, the term "continuous" refers to a layer that covers an entire exposed surface without gaps or bare spots that reveal material underlying the deposited layer. A continuous layer may have gaps or bare spots with a surface area less than about 15% or less than about 10% of the total surface area of the layer. Once the predetermined thickness of the aluminum (Al) layer 34 has been deposited at operation 60, the method 50 moves to operation 62.

At operation 62, the substrate 32 is moved to a third processing chamber. The third processing chamber having a sub-zero chilling pedestal, or a sub-zero cooling pedestal, therein. In the third processing chamber, at operation 64, the substrate 32 is cooled to a temperature that is less than or equal to −20° C. At operation 66, the substrate 32 may be allowed to warm to room temperature, or in a range of from 20° C. to 25° C.

Without intending to be bound by theory, it is thought that cooling a substrate 32 with an aluminum layer 34 after deposition induces tensile stress in the aluminum layer 32, leading to bowing of the substrate 32. Additionally, heating the aluminum layer 34 after deposition can also induce tensile stress to the aluminum and lead to bowing of the substrate 32. Accordingly, in one or more embodiments, cooling the substrate 32 having the aluminum layer 34 thereon to a temperature that is less than or equal to −20° C. followed by heating the substrate 32 with the aluminum layer 34 thereon counteracts the tensile stress causes by the cooling and reduces the overall film stress and bowing caused.

Referring to FIG. 2B, the method 70 may be performed in a processing tool. At operation 72 of method 70, a substrate is provided and exposed to a vacuum in the first processing chamber. At operation 74, the substrate is moved to a second processing chamber. At operation 76, the substrate is, optionally, cooled. At operation 78, the substrate is moved to the first deposition chamber. At operation 80, an aluminum layer is deposited on the substrate. At operation 82, the substrate is moved to a third processing chamber. At operation 84, the substrate is cooled. At operation 86, the substrate is moved to a fourth processing chamber, the fourth processing chamber having a sub-zero chilling pedestal, or a sub-zero cooling pedestal, in it. At operation 88, the substrate is cooled to a temperature of less than or equal to 20° C., or less than or equal to 10° C., or less than or equal to 0° C., or less than or equal to −20° C. At optional operation 90, the substrate may be warmed to room temperature.

With reference to FIG. 2B and FIG. 1B, in one or more embodiments, the substrate or wafer 32 may comprise any suitable substrate known to the skilled artisan, as discussed above. At operation 72, the substrate 32 is exposed to a vacuum in a first processing chamber as a purge gas is flowed over the substrate 32 to purge the reaction zone or otherwise remove any residual reactive compounds or reaction-by-products from the surface of the substrate 32 and from the reaction zone. The purge gas may comprise any inert gas known to the skilled artisan. In one or more embodiments, the purge gas is selected from one or more of nitrogen ($N_2$), helium (He), and argon (Ar). In one or more embodiments, the substrate 32 is purged at operation 72 at a temperature in a range of from 150° C. to 400° C.

At operation 74, the substrate 32 is moved to a second processing chamber, where, at operation 76 the substrate 32 is cooled to a temperature in a range or from 50° C. to 150° C., including a temperature of about 50° C., about 60° C., about 70° C., about 80° C., about 90° C., about 100° C., about 110° C., about 120° C., about 130° C., about 140° C., and about 150° C. In some embodiments, the substrate 32 is cooled while also being kept under vacuum.

With reference to FIG. 2B and FIG. 1B, at operation 78, the substrate 32 is moved to a first deposition chamber, where, at operation 80, an aluminum layer 34 is deposited on a top surface 33 of the substrate 32. In one or more embodiments, the aluminum (Al) layer 34 is deposited by sputtering or physical vapor deposition (PVD). In one or more embodiments, an aluminum layer 34 is deposited using a direct current (DC) PVD process or a radiofrequency (RF) PVD process. Accordingly, an aluminum target is sputtered onto the semiconductor substrate 32 to form the aluminum (Al) layer 34.

In one or more embodiments, the PVD process comprises RF sputtering and DC sputtering. In one or more embodiments, the DC is supplied to the semiconductor substrate 32 or metal target and the RF is supplied to the pedestal (not shown). In one or more embodiments, the DC component has a power in a range of from 0 kilowatt (KW) to 100 kW, 10 kW to 80 kW, 20 kW to 60 kW, 30 kW to 50 kW, or 40 kW to 50 kW. In one or more embodiments, RF component has a power in range of from 0 kW to 10 kW, 1 kW to 10 kW, 3 kW to 10 kW, 5 kW to 10 kW, 7 kW to 10 kW, 1 kW to 7 kW, 3 kW to 7 kW, 5 kW to 7 kW, 1 kW to 5 kW, 3 kW to 5 kW, or 1 kW to 3 kW.

In one or more embodiments, the PVD process occurs at a temperature in a range of from 200° C. to 450° C., 250° C. to 450° C., 300° C. to 450° C., 350° C. to 450° C., 400° C. to 450° C., 200° C. to 400° C., 250° C. to 400° C., 300° C. to 400° C., 350° C. to 400° C., 200° C. to 350° C., 250° C. to 350° C., 300° C. to 350° C., 200° C. to 300° C., 250° C. to 300° C., or 200° C. to 250° C.

In one or more embodiments, the PVD process occurs at a pressure in a range of from 0.5 mTorr to 500 mTorr, 10 mTorr to 500 mTorr, 25 mTorr to 250 mTorr, or 50 mTorr to 150 mTorr.

In one or more embodiments, the aluminum (Al) layer 34 has a thickness in a range of from 1 μm to 6 μm, or in a range of from 2 μm to 5 μm. In one or more embodiments, the aluminum (Al) layer 34 is a continuous layer. Once the predetermined thickness of the aluminum (Al) layer 34 has been deposited at operation 80, the method 70 moves to operation 82.

At operation 82, the substrate 32 is moved to a third processing chamber. The third processing chamber. In the third processing chamber, at operation 84, the substrate 32 is cooled to a temperature in a range or from 50° C. to 150° C., including a temperature of about 50° C., about 60° C., about 70° C., about 80° C., about 90° C., about 100° C., about 110° C., about 120° C., about 130° C., about 140° C., and about 150° C. In some embodiments, the substrate 32 is cooled while also being kept under vacuum.

At operation 86, the substrate 32 is moved to a fourth processing chamber, which has a sub-zero chilling pedestal or a sub-zero cooling pedestal. At operation 88, in the fourth processing chamber, the substrate 32 is cooled to a temperature that is less than or equal to −20° C.

At operation 90, the substrate 32 may be allowed to warm to room temperature, or in a range of from 20° C. to 25° C.

Without intending to be bound by theory, it is thought that cooling a substrate 32 with an aluminum layer 34 after deposition induces tensile stress in the aluminum layer 32, leading to bowing of the substrate 32. Additionally, heating the aluminum layer 34 after deposition can also induce tensile stress to the aluminum and lead to bowing of the substrate 32. Accordingly, in one or more embodiments, the substrate 32 having the aluminum layer 34 thereon is advantageously cooled to a temperature that is less than or equal to −20° C. followed by heating the substrate 32 with the aluminum layer 34 thereon counteracts the tensile stress caused by the cooling and reduces the overall film stress and bowing caused.

In the illustrated example of FIG. 3, the factory interface 102 includes a docking station 140 and factory interface robots 142 to facilitate transfer of wafers. The docking station 140 is configured to accept one or more front opening unified pods (FOUPs) 144. In some examples, each factory interface robot 142 generally comprises a blade 148 disposed on one end of the respective factory interface robot 142 configured to transfer the wafers from the factory interface 102 to the load lock chambers 104, 106.

The load lock chambers 104, 106 have respective ports 150, 152 coupled to the factory interface 102 and respective ports 154, 156 coupled to the transfer chamber 108. The transfer chamber 108 further has respective ports 158, 160 coupled to the holding chambers 116, 118 and respective ports 162, 164 coupled to processing chambers 120, 122. Similarly, the transfer chamber 110 has respective ports 166, 168 coupled to the holding chambers 116, 118 and respective ports 170, 172, 174, 176 coupled to processing chambers 124, 126, 130. The ports 154, 156, 158, 160, 162, 164, 166, 168, 170, 172, 174, 176 can be, for example, slit valve openings with slit valves for passing wafers therethrough by the transfer robots 112, 114 and for providing a seal between respective chambers to prevent a gas from passing between the respective chambers. Generally, any port is open for transferring a wafer therethrough. Otherwise, the port is closed.

The load lock chambers 104, 106, transfer chambers 108, 110, holding chambers 116, 118, and processing chambers 120, 122, 124, 126, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 142 transfers a wafer from a FOUP 144 through a port 150 or 152 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the wafer between, for example, the atmospheric environment of the factory interface 102 and the low pressure or vacuum environment of the transfer chamber 108.

With the wafer in the load lock chamber 104 or 106 that has been pumped down, the transfer robot 112 transfers the wafer from the load lock chamber 104 or 106 into the transfer chamber 108 through the port 154 or 156. The transfer robot 112 is then capable of transferring the wafer to and/or between any of the processing chambers 120, 122 through the respective ports 162, 164 for processing and the holding chambers 116, 118 through the respective ports 158, 160 for holding to await further transfer. Similarly, the transfer robot 114 is capable of accessing the wafer in the holding chamber 116 or 118 through the port 166 or 168 and is capable of transferring the wafer to and/or between any of the processing chambers 124, 126, 130 through the respective ports 170, 172, 174, 176 for processing and the holding chambers 116, 118 through the respective ports 166, 168 for holding to await further transfer. The transfer and holding of the wafer within and among the various chambers can be in the low pressure or vacuum environment provided by the gas and pressure control system.

The processing chambers 120, 122, 124, 126, 130 can be any appropriate chamber for processing a wafer. In some embodiments, the processing chamber 120 can be capable of performing a purge process, the processing chamber 124 can be capable of depositing an aluminum layer, and the processing chambers 126, 130 can be capable of cooling a substrate to −20° C. because of the presence of a sub-zero chilling pedestal or a sub-zero cooling pedestal therein.

A system controller 190 is coupled to the processing system 100 for controlling the processing system 100 or components thereof. For example, the system controller 190 may control the operation of the processing system 100 using a direct control of the chambers 104, 106, 108, 116, 118, 110, 120, 122, 124, 126, 130 of the processing system 100 or by controlling controllers associated with the chambers 104, 106, 108, 116, 118, 110, 120, 122, 124, 126, 130. In operation, the system controller 190 enables data collection and feedback from the respective chambers to coordinate performance of the processing system 100.

The system controller 190 generally includes a central processing unit (CPU) 192, memory 194, and support circuits 196. The CPU 192 may be one of any form of a general-purpose processor that can be used in an industrial setting. The memory 194, or non-transitory computer-readable medium, is accessible by the CPU 192 and may be one or more of memory such as random-access memory (RAM), read only memory (ROM), floppy disk, hard disk, or any other form of digital storage, local or remote. The support circuits 196 are coupled to the CPU 192 and may comprise cache, clock circuits, input/output subsystems, power supplies, and the like. The various methods disclosed herein may generally be implemented under the control of the CPU 192 by the CPU 192 executing computer instruction code stored in the memory 194 (or in memory of a particular process chamber) as, for example, a software routine. When the computer instruction code is executed by the CPU 192, the CPU 192 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Referring to FIG. 2A and FIG. 3, in one or more embodiments, the method 50 may be performed in a processing tool 100. At operation 52 of method 50, a substrate is provided and exposed to a vacuum in the first processing chamber 120. At operation 54, the substrate is moved to a holding chamber 116. At operation 56, the substrate is cooled while in the holding chamber 116. At operation 58, the substrate is moved to the first deposition chamber 124, where, at operation 60, an aluminum layer is deposited on the substrate. At operation 62, the substrate is moved to a holding chamber 118, the holding chamber 118 having a sub-zero chilling pedestal or a sub-zero cooling pedestal in it. At operation 64, while in the holding chamber 118, the substrate is cooled to a temperature of less than or equal to −20° C. At optional operation 66, the substrate may be moved to load lock chamber 106, where the substrate is warmed to room temperature.

Referring to FIG. 2B and FIG. 3, in one or more embodiments, the method 70 may be performed in a processing tool 100. At operation 72 of method 70, a substrate is provided and exposed to a vacuum in the first processing chamber 120. At operation 74, the substrate is moved to a holding chamber 116, wherein, at operation 76, the substrate is cooled. At operation 78, the substrate is moved to a first deposition chamber 124, where, at operation 80, an aluminum layer is deposited on the substrate. At operation 82, the substrate is moved to a holding chamber 118, where, at operation 84, the substrate is cooled. At operation 86, the substrate is moved to a load lock chamber 106, the load lock chamber 106 having a sub-zero chilling pedestal or a sub-zero cooling pedestal in it. At operation 88, the substrate is cooled in the load lock chamber 106 to a temperature of less than or equal to –20° C. At optional operation 90, the substrate may be removed from the processing tool and warmed to room temperature.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of manufacturing a semiconductor device, the method comprising:
   cooling a substrate under vacuum to a temperature in a range of from 50° C. to 150° C. to form a cooled substrate;
   subsequently depositing an aluminum layer directly on a top surface of the cooled substrate to form a substrate having an aluminum layer directly thereon, the aluminum layer having a thickness in a range of from 1 μm to 6 μm; and
   subsequently cooling the substrate having the aluminum layer directly thereon under vacuum on a sub-zero cooling pedestal to a temperature less than or equal to –20° C.

2. The method of claim 1, further comprising:
   prior to cooling the substrate to a temperature in a range of from 50° C. to 150° C., exposing the substrate to a vacuum.

3. The method of claim 2, wherein the substrate is exposed to the vacuum at a temperature in a range of from 150° C. to 400° C.

4. The method of claim 1, wherein the aluminum layer is deposited at a temperature in a range of from 200° C. to 450° C.

5. The method of claim 1, wherein the aluminum layer is deposited by a physical vapor deposition process.

6. The method of claim 1, wherein the method is performed in situ in an integrated processing tool without breaking vacuum or without exposure to ambient air.

7. The method of claim 1, further comprising warming the substrate having the aluminum layer thereon to room temperature after cooling to less than or equal to –20° C.

8. A method of reducing stress on a semiconductor substrate, the method comprising:
   exposing the semiconductor substrate to a vacuum in a first processing chamber;
   cooling the semiconductor substrate in a second processing chamber to a temperature in a range of 50° C. to 150° C. to form a cooled semiconductor substrate;
   depositing an aluminum layer directly on a top surface of the cooled semiconductor substrate, the semiconductor substrate in a first deposition chamber to form a semiconductor substrate having an aluminum layer directly thereon, the aluminum layer having a thickness in a range of from 1 μm to 6 μm; and
   cooling the semiconductor substrate having the aluminum layer directly thereon in a third processing chamber under vacuum on a sub-zero cooling pedestal to a temperature less than or equal to –20° C.

9. The method of claim 8, wherein the first processing chamber has a temperature in a range of from 150° C. to 400° C.

10. The method of claim 8, wherein the aluminum layer is deposited at a temperature in a range of from 200° C. to 400° C.

11. The method of claim 8, wherein the aluminum layer is deposited by a physical vapor deposition process.

12. The method of claim 8, wherein the method is performed in situ in an integrated processing tool without breaking vacuum or without exposure to ambient air.

13. The method of claim 8, further comprising warming the semiconductor substrate having the aluminum layer thereon to room temperature.

* * * * *